United States Patent [19]
Zimmer et al.

[11] Patent Number: 6,054,183
[45] Date of Patent: *Apr. 25, 2000

[54] METHOD FOR MAKING CVD DIAMOND COATED SUBSTRATE FOR POLISHING PAD CONDITIONING HEAD

[76] Inventors: Jerry W. Zimmer, 21260 Glenmount, Saratoga, Calif. 95070; Joseph E. Yehoda, 5165 Shawnee Blvd., Schnecksville, Pa. 18078

[ * ] Notice: This patent is subject to a terminal disclaimer.

[21] Appl. No.: 09/111,920

[22] Filed: Jul. 8, 1998

Related U.S. Application Data

[60] Provisional application No. 60/052,145, Jul. 10, 1997.
[51] Int. Cl.$^7$ .................................................. C23C 16/26
[52] U.S. Cl. .................... 427/249.8; 427/249.11; 427/249.12; 427/255.7; 427/122
[58] Field of Search ................ 427/249.8, 577, 427/122, 255.7, 249.11, 249.12; 451/539, 526

[56] References Cited

U.S. PATENT DOCUMENTS

| | | |
|---|---|---|
| 5,186,973 | 2/1993 | Garg et al. . |
| 5,485,804 | 1/1996 | Adair et al. . |
| 5,536,202 | 7/1996 | Appel et al. . |
| 5,665,201 | 9/1997 | Sahota ..................................... 438/693 |
| 5,921,856 | 7/1999 | Zimmer .................................. 451/539 |

*Primary Examiner*—Roy V. King
*Attorney, Agent, or Firm*—Coudert Brothers

[57] ABSTRACT

A flat substrate polishing and polishing pad conditioning head for a chemical-mechanical-planarization apparatus is provided which has been shown to double the useable life of a polishing pad used to planarize and/or polish both oxide and metal outer layers in the processing of semiconductor wafers and to provide for more uniform polishing during the life of the polishing pad. The polishing pad conditioning head comprises a suitable substrate (26), a diamond grit (28) that is evenly distributed over the surface of the substrate (26) and a CVD diamond (30) grown onto the diamond grit (28) and the substrate (26) so that the diamond grit (28) becomes encased in the CVD diamond (30) and bonded to the surface of the substrate (26). The method for evenly distributing a mono-layer of diamond grit in a highly uniform manner over the exposed surface of a substrate can be done either by using diamond grit applied over a photoresist pattern or a screen printed pattern, or using diamond grit from a liquid mixture.

53 Claims, 7 Drawing Sheets

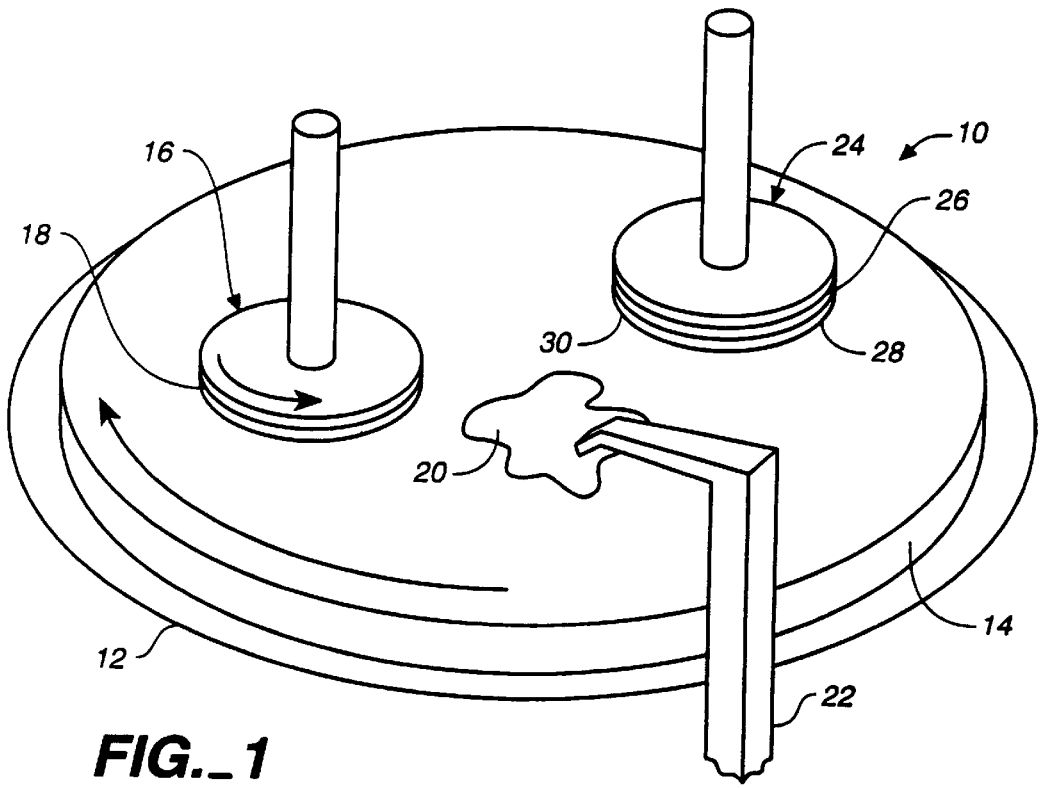
FIG._1
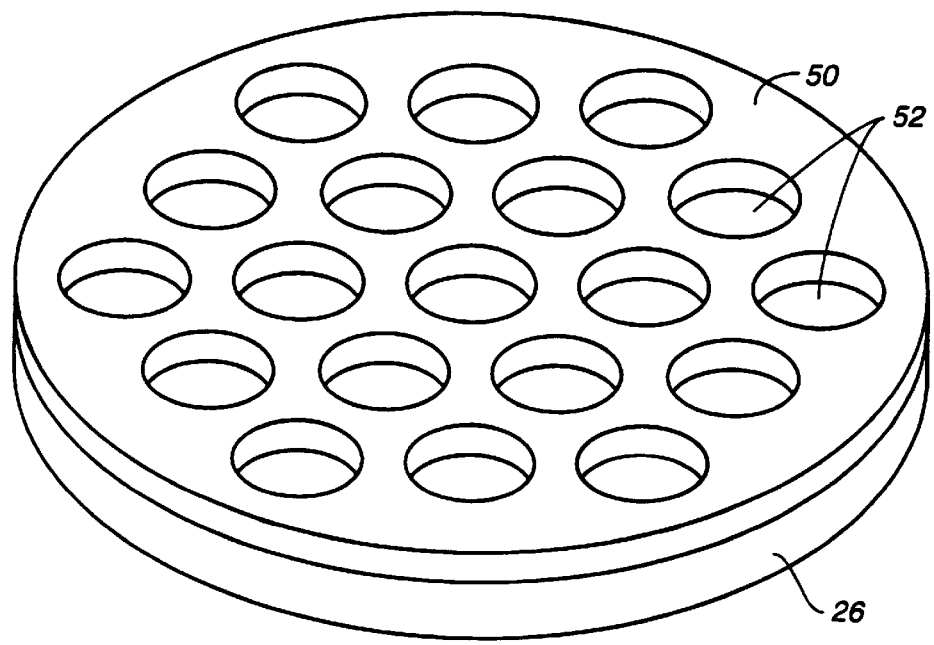
FIG._7A

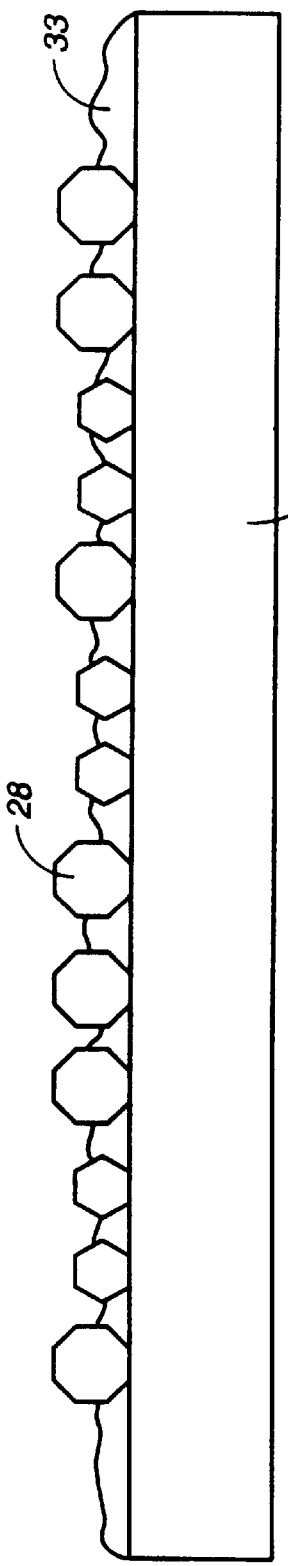
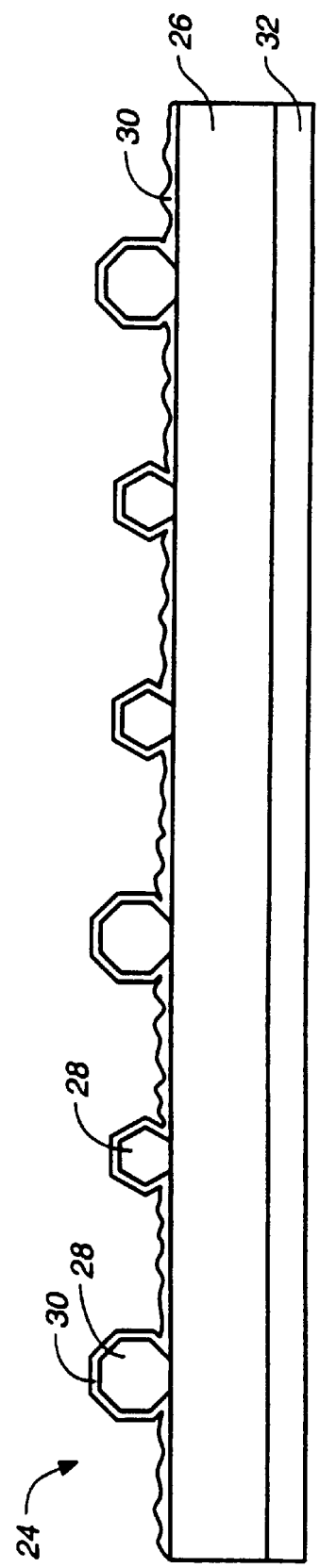

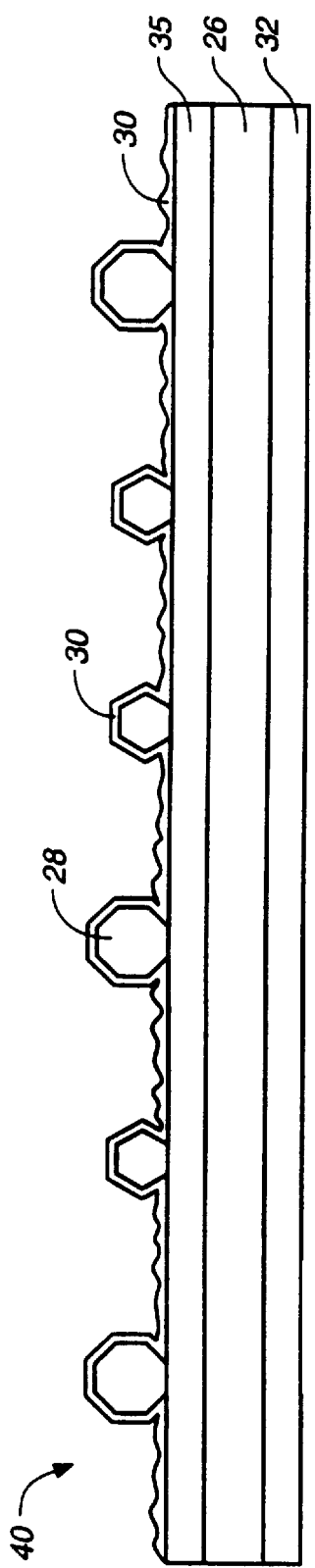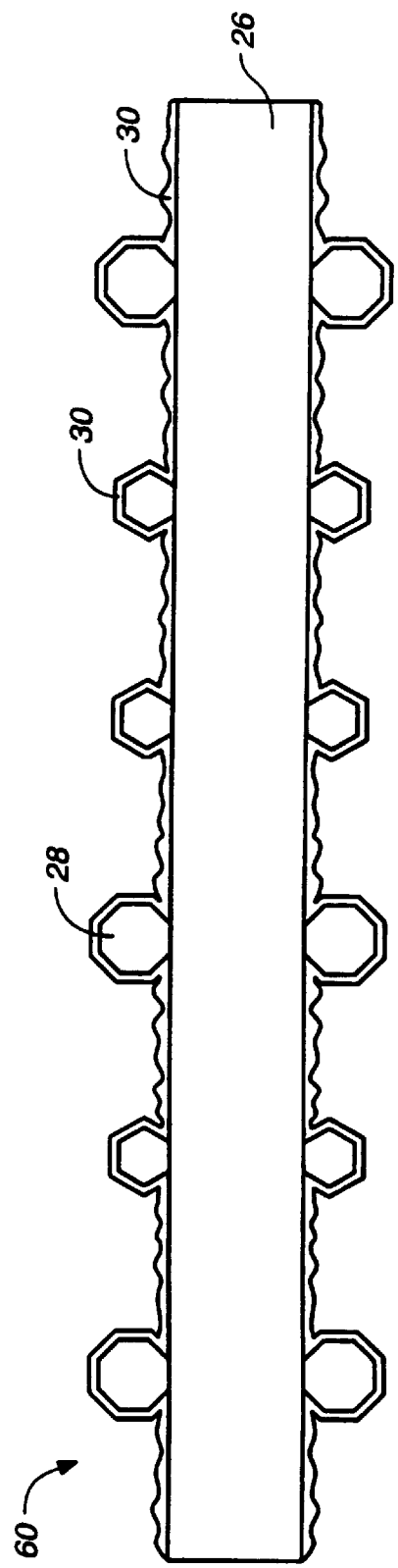

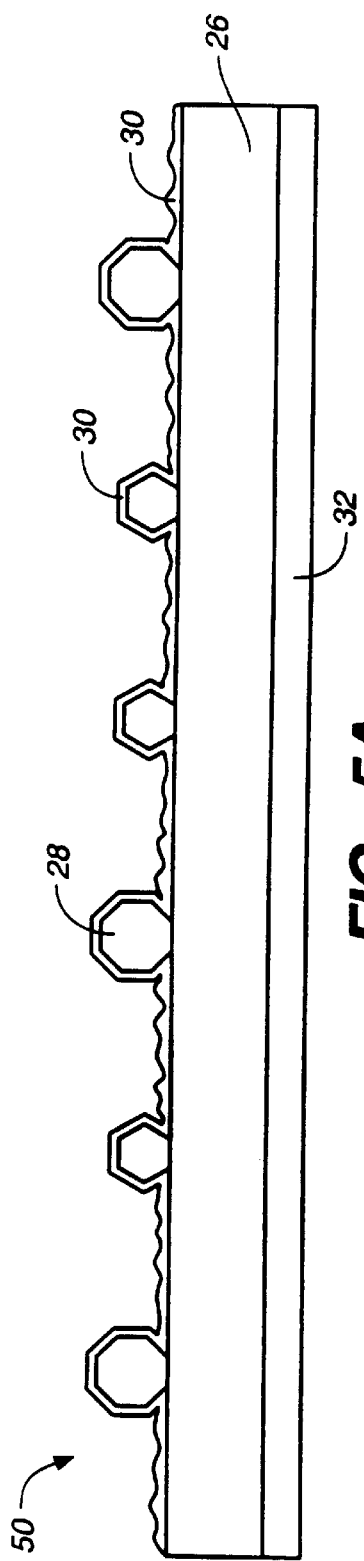
FIG._5A
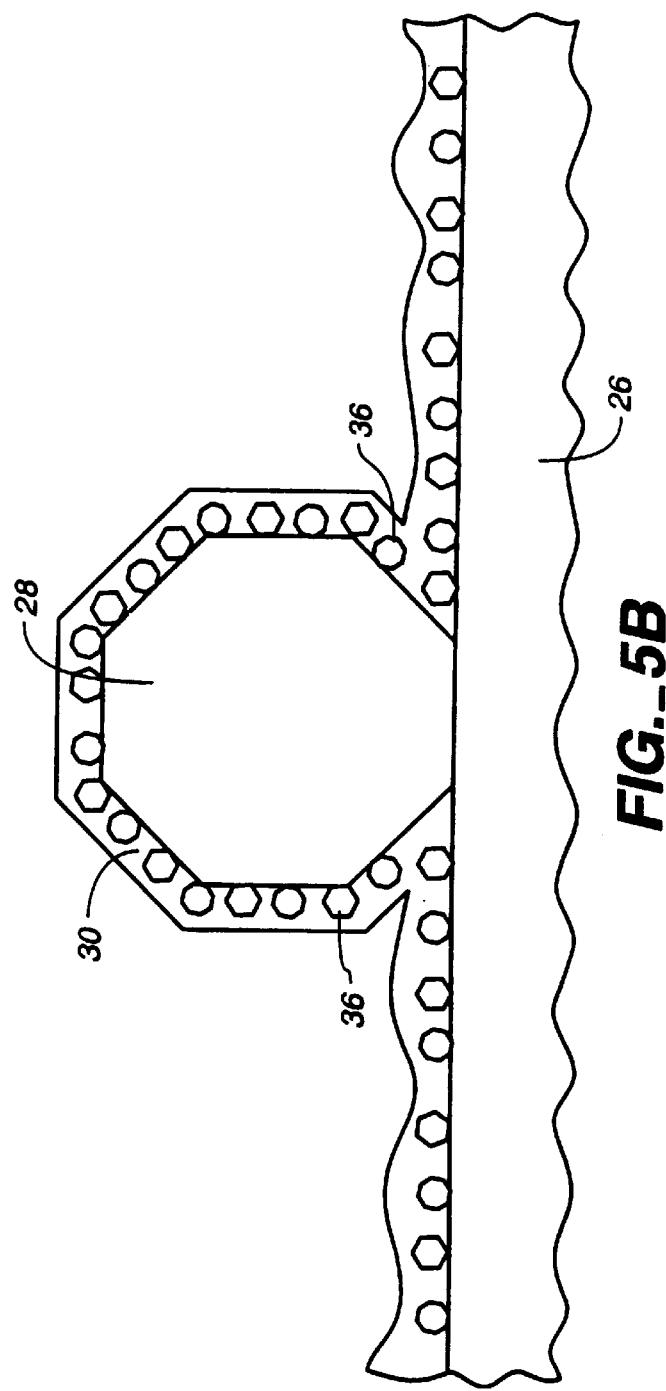
FIG._5B

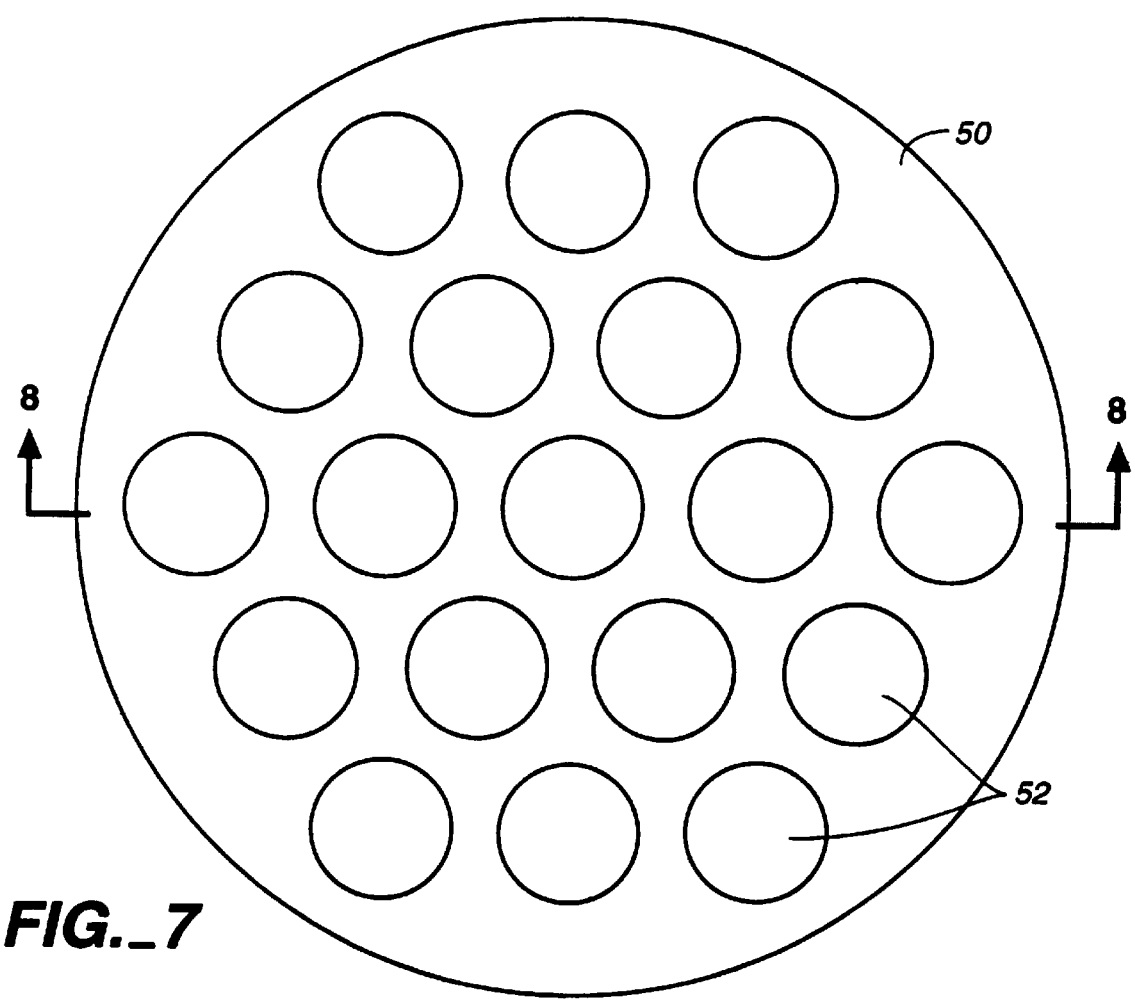
FIG._7
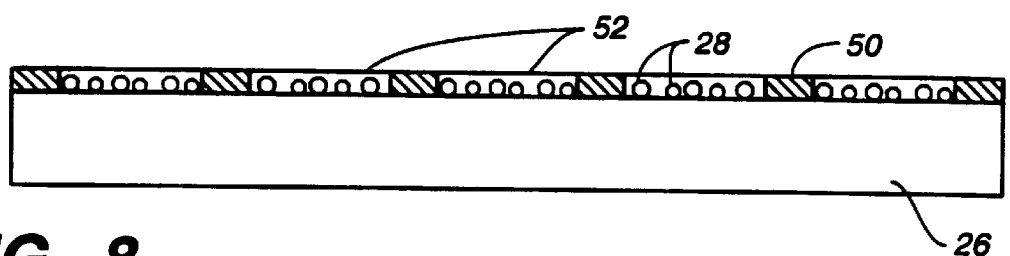
FIG._8

FIG._9A
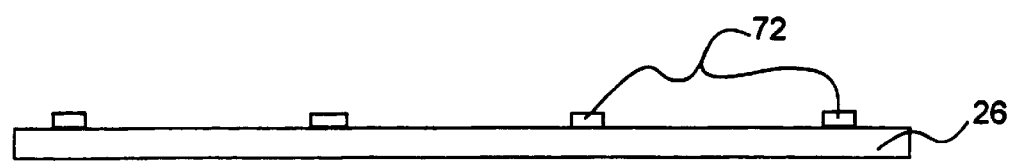
FIG._9B
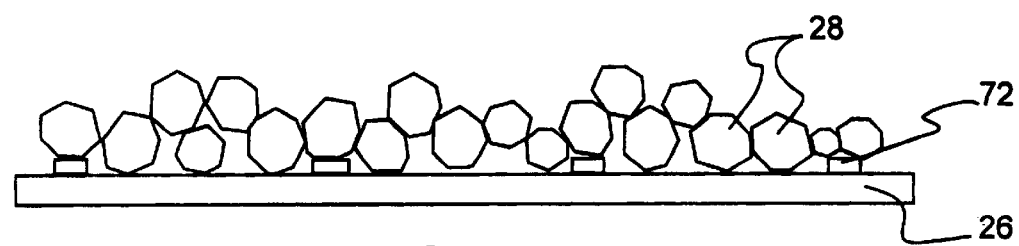
FIG._9C
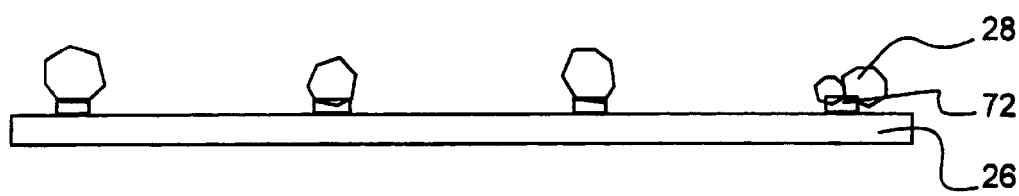
FIG._9D
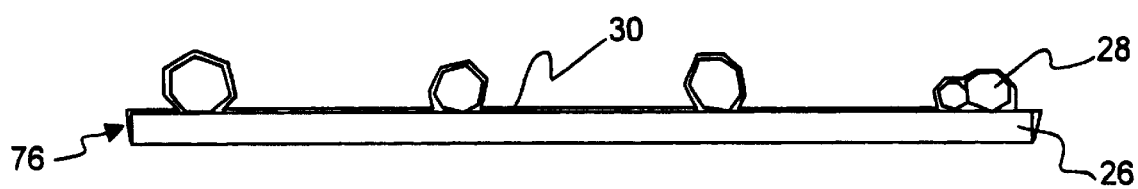
FIG._9E

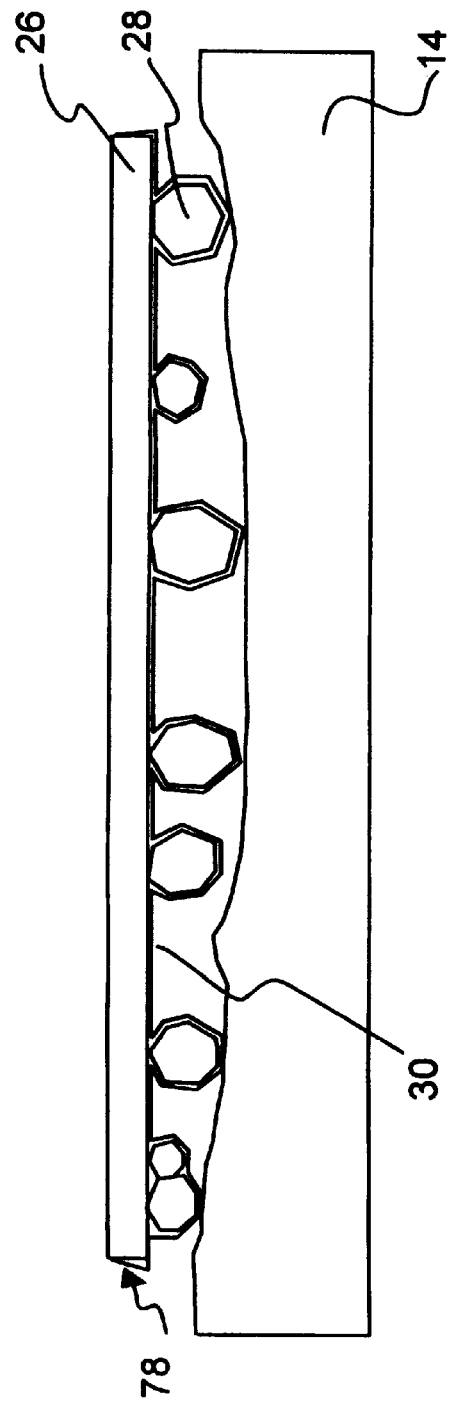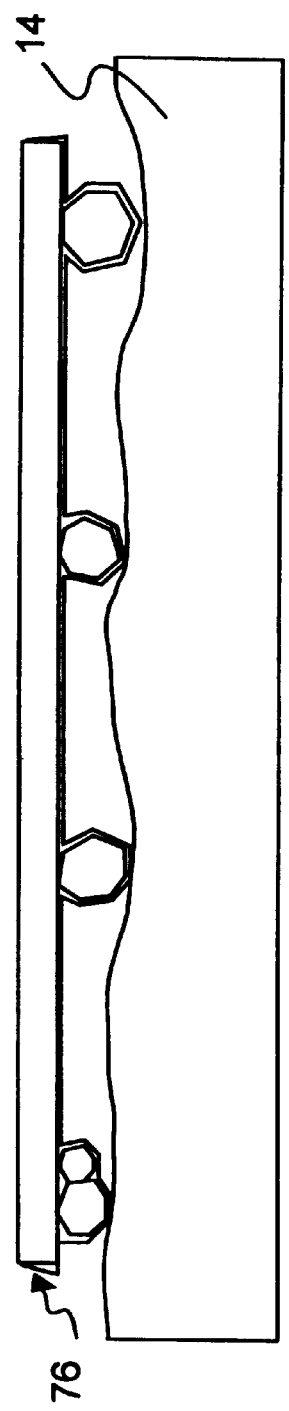

METHOD FOR MAKING CVD DIAMOND COATED SUBSTRATE FOR POLISHING PAD CONDITIONING HEAD

This application claims the benefit of prior U.S. provisional application Ser. No. 60/052,145, filed Jul. 10, 1997.

FIELD OF THE INVENTION

The present invention relates to flat substrate polishing and Chemical-Mechanical-Planarization (CMP) polishing pad conditioning heads or disks. This invention is capable of conditioning polishing pads used to planarize and/or polish both dielectric and semiconductor (oxide) films and metal films on semiconductor wafers as well as wafers and disks used in computer hard disk drives. This invention also relates to continuous CVD diamond coated substrates having sufficient surface roughness for use in other abrasive sanding, grinding or polishing tools.

BACKGROUND OF THE INVENTION

CMP represents a major portion of the production cost for semiconductor wafers. These CMP costs include polishing pads, polishing slurry, pad conditioning disks and a variety of CMP parts that become worn during the planarizing and polishing operations. The total cost for the polishing pad, the downtime to replace the pad and the cost of the test wafers to recalibrate the pad is approximately $7 for a single wafer polishing run. In many complex integrated circuit devices, up to five CMP runs are required for each finished wafer which further increase the total manufacturing costs for such wafers.

The greatest amount of wear on the polishing pads is the result of polishing pad conditioning that is necessary to place the pad into a suitable condition for these wafer planarization and polishing operations. A typical polishing pad comprises a closed-cell polyurethane foam approximately 1/16 inch thick. During pad conditioning, the pads are subjected to mechanical abrasion to physically cut through the cellular layers of the surface of the pad. The exposed surface of the pad contains open cells which trap an abrasive slurry consisting of the spent polishing slurry and material removed from the wafer. In each subsequent pad conditioning step, the ideal conditioning head removes only the outer layer of cells containing the embedded materials without removing any of the layers below the outer layer. Such an ideal conditioning head would achieve a 100% removal rate with the lowest possible removal of layers on the polishing pad, i.e., lowest possible pad wear rate. It is apparent that a 100% removal rate can be achieved if there were no concern for its adverse affect of wear on the pad. However, such over-texturing of the pad results in a shortening of the pad life. On the other hand, under-texturing results in insufficient material removal rate during the CMP step and lack of wafer uniformity. Using the prior art conditioning heads that achieve satisfactory removal rates, as low as 200 to 300 and as high as several thousand wafer polishing runs, depending on the specific run conditions, can be made before the pad becomes ineffective and must be replaced. This occurs after the pad is reduced approximately to half of its original thickness.

There is a great need for a conditioning head that achieves as close to the ideal balance between high wafer removal rates and low pad wear rate so that the polishing pad effective life can be significantly increased without sacrificing the quality of the conditioning.

The prior art conditioning heads typically comprise a stainless steel plate, a non-uniform distribution of diamond grit over the surface of the plate and a wet chemical plated over-coat of nickel to cover the plate and the grit. The use of such prior art conditioning heads is limited to the conditioning of polishing pads which have been used during oxide CMP wafer processing, i.e. when the exposed outer layer is an oxide-containing material as opposed to metal. In processing a semiconductor wafer, there are about the same number of oxide and metal CMP processing steps. However, the prior art heads are ineffective for conditioning metal processing operations. This is the case because the slurry used to remove metal from the wafer reacts with the nickel and degrades and otherwise dissolves the nickel outer layer of the conditioning head and causes a major loss of the diamond grit from the plate, potentially scratching the wafers.

There is a great need for a head that is effective in conditioning both oxide-containing and metal-containing wafer surfaces. There is also a great need for a conditioning head in which the diamond grit is more firmly attached to the underlying substrate. There is also a need for a conditioning head that provides a greater degree of uniformity of wafer material being removed from a given wafer during the CMP operation. Finally, there is a need for a conditioning head that extends the life of the polishing pads.

SUMMARY OF THE INVENTION

The present invention and the invention described and claimed in a copending application, Zimmer, U.S. patent application Ser. No. 09/094,930, filed Jun. 10, 1998, are both directed to a polishing pad conditioning head for a CMP and similar types of apparatus that has been found to double the life of the polishing pad without sacrificing wafer removal rates and methods for making the polishing pad conditioning heads. In addition, the conditioning head of the present invention and the copending application:

(1) are effective in conditioning polishing pads used to process metal as well as oxide surfaces;

(2) are manufactured so that the diamond grit is more firmly attached to the substrate and consequently does not detach from the substrate to potentially scratch the wafer; and (3) provide a greater degree of uniformity of material removed across a given wafer.

In a CMP and similar apparatus, a polishing pad conditioning head is provided which comprises a substrate, a mono-layer of diamond grit substantially uniformly distributed on the substrate, and an outer layer of chemical vapor deposited (CVD) diamond grown onto the resulting grit covered substrate to encase and bond said polycrystalline diamond grit to said surface.

By the term of "chemical vapor deposited", it is intended to mean materials deposited by vacuum deposition processes, including thermally-activated deposition from reactive gaseous precursor materials; and plasma, microwave, and DC or RF plasma arc-jet deposition from gaseous precursor materials.

BRIEF DESCRIPTION OF DRAWINGS

FIG. 1 illustrates a CMP apparatus in accordance with the present invention;

FIG. 2 illustrates a diagrammatic cross-sectional view of a polishing pad conditioning head in accordance with the prior art;

FIG. 3 illustrates a diagrammatic cross-sectional view of a polishing pad conditioning head in accordance with one embodiment of the present invention;

FIG. 4 illustrates a diagrammatic cross-sectional view of a polishing pad conditioning head in accordance with another embodiment of the present invention;

FIG. 5A illustrates a diagrammatic cross-sectional view of a polishing pad conditioning head in accordance with still another embodiment of the present invention;

FIG. 5B illustrates a detailed cross-sectional view of the polishing pad conditioning head shown in FIG. 5A;

FIG. 6 illustrates a diagrammatic cross-sectional view a polishing pad conditioning head in accordance with another embodiment of the present invention;

FIG. 7 illustrates a top view of a patterned shield used in another embodiment of the present invention;

FIG. 7A illustrates the patterned shield of FIG. 7 on a wafer;

FIG. 8 illustrates a diagrammatic cross-sectional view of the patterned shield of FIG. 7A and a distribution of diamond grit on the wafer;

FIG. 9A illustrates the first step of using a photoresist pattern in a preferred embodiment of the present invention;

FIG. 9B illustrates the second step of using a photoresist pattern in a preferred embodiment of the present invention;

FIG. 9C illustrates the third step of using a photoresist pattern in a preferred embodiment of the present invention;

FIG. 9D illustrates results after the fourth, fifth and sixth steps of using a photoresist pattern in a preferred embodiment of the present invention;

FIG. 9E illustrates the final step of using a photoresist pattern in a preferred embodiment of the present invention;

FIG. 10 illustrates a diagrammatic cross-sectional view of a polishing pad being conditioned by conditioning head in which the diamond grit is not uniformly distributed on the wafer; and FIG. 11 illustrates a diagrammatic cross-sectional view of a polishing pad being conditioned by conditioning head in which the diamond grit is very uniformly distributed on the wafer in accordance with the process shown in FIGS. 9A–9E.

DESCRIPTION OF THE PREFERRED EMBODIMENTS OF THE INVENTION

CMP apparatus 10 illustrated in FIG. 1 contains platen 12 with polishing pad 14 securely fastened thereto. Polishing pad 14 is shown rotating, for example, in a clockwise direction. Semiconductor wafer holder 16 with wafer 18 is positioned as shown to urge and maintain wafer 18 against the exposed surface of pad 14. Holder 16 is shown rotating, for example, in a counterclockwise direction. Wafer 18 is secured to holder 16 by means of a vacuum or other means well known in the art. Polishing slurry 20 is dispensed within the center region of pad 14 through the nozzle of conduit 22. Slurry 20 typically consists of silicon dioxide dispersed within a suitable liquid such as potassium hydroxide diluted with water. The exact composition of the slurry is closely calculated to provide the desired planarization of the exposed surface of the wafer. Although apparatus 10 shows only one wafer holder, CMP equipment is commercially available that includes multiple holders.

Polishing pad conditioning head or disk 24 comprises substrate 26, natural or synthetic diamond grit 28 evenly distributed over the surface of substrate 26 and a continuous thin film 30 of CVD polycrystalline diamond (hereinafter referred to as "CVD diamond") grown onto grit 28 and substrate 26 so that grit 28 is encased in CVD diamond 30 and bonded to the surface of substrate 26.

FIG. 2 shows a cross-section of a prior art conditioning head in which a non-uniform layer of diamond grit 28 is distributed on the surface of backing plate 32, such as stainless steel plate, and nickel plating 33 is deposited by a wet chemical process to insecurely bond the diamond grit 28 to backing plate 32.

FIG. 3 shows a cross-section of conditioning disk 34 that is of substantially the same composition as conditioning head 24 described above except for the optional backing plate 32. Substrate 26 comprises any material on which it is possible to deposit a coating of CVD diamond including, but not limited to silicon, refractory metals such as molybdenum and tungsten, ceramic materials, e.g., silicon carbide, silicon nitride, SiAlON, aluminum nitride, tungsten carbide, sintered cobalt-cemented tungsten carbide, and similar materials. The substrate is usually in the form of a disk ranging in diameter from about two (2) to four (4) inches. However, other shapes have been used as the substrate for conditioning heads. The thickness of substrate 26 ranges from about 0.02 to about 0.25 inch, preferably 0.04 to 0.08 inch.

Preparation of polishing pad conditioning head or disk 34 in FIG. 3 is performed according to the following method. In the first step, a mono-layer of large diamond grit having an average particle diameter in the range of about 15 to about 150 microns is deposited onto substrate 26 in a highly uniform manner. The density of large diamond grit on the surface of substrate 26 is about 0.1 to about 50 grains per $mm^2$. Preferably, the density of large diamond grit on the surface of the substrate is about 1 to about 30 grains per $mm^2$.

There are several methods for preparation of a layer of diamond grit ("seeding") uniformly on the substrate. The first seeding method employs mechanical spreading of diamond grit by an air dispersion technique in which diamond grit is dropped at a controlled rate from a fixed height onto the substrate. A moving air current may be used to disperse the grit in a lateral direction across the substrate. The grit container may be moved in a direction orthogonal to the direction of the air current while the grit is dropped onto the substrate to provide a uniform distribution of grit across the entire exposed surface of the substrate. The substrate may be rotated during this procedure to improve the uniformity of the distribution of diamond grit on the substrate. The density of the grit on the substrate is controlled by both the supply rate of the grit feed as well as the rate of translation of the substrate. Alternatively, the substrate may be moved in an orthogonal direction while the grit is being dropped onto the wafer to provide a uniform distribution of grit across the entire exposed surface of the substrate. In a variation of this seeding method, a pre-measured amount of diamond grit is placed on a small surface above the surface of the substrate. A timed high velocity jet of air is aimed at this grit and the grit is blown into a cloud in a contained region above the surface of the substrate. The grit subsequently settles out of the cloud onto the surface of the substrate in a very uniform pattern. Density of the grit in the pattern is controlled by and proportional to the amount of grit blown into the cloud.

A still more uniform distribution of diamond grit particles can be applied over the entire substrate surface by a variety of non-mechanical techniques, which are discussed below as the second through fifth seeding methods.

In the second seeding method, in accordance with Adair, et al, U.S. Pat. No. 5,485,804, the substrate is coated with a thin film of polymer such as polyethyleneimine (PEI), which is capable of producing a positive electrical charge on the surface. The polymer-coated surface is then immersed in an aqueous suspension of diamond particles. Because the diamond particles in suspension have a negative charge, which is opposite that of the polymer-coated surface, the diamond particles are attracted to the surface and adhere to the surface via strong electrostatic forces. The diamond-seeded substrate is then rinsed with water to remove excess diamond particles, leaving behind essentially a monolayer of diamond particles on the surface.

The third seeding method is similar to the second method, except a non-aqueous suspension of diamond particles is utilized. The inventors have unexpectedly found that the uniformity and control of the seeding process is improved by using a diamond suspension or mixture of diamond particles in alcohol, instead of water as in the '804 patent. The type of alcohol may be methanol, ethanol, propanol, butanol, or other organic alcohols, but isopropyl alcohol (IPA) is preferred. In the diamond/alcohol mixture, the diamond particles develop a negative surface charge which causes them to be attracted to the positive charge on polymer-coated substrate surface.

In the fourth seeding method the substrate to be seeded is configured as the positive electrode in a suspension of diamond particles in alcohol, preferably IPA. A negative electrode of similar size is placed opposite and about 1 cm away from the substrate in the solution. The large diamond grit particles are attracted to the substrate by application of a voltage of approximately 5 to 300 V, preferably 50 to 100 V, for time intervals of approximately 5 to 120 seconds. Afterwards, the substrates are removed from the solution and dried by methods such as air drying or spin drying.

In the fifth seeding method, the substrate is first covered with a uniform layer of resist. The layer of resist may be applied by spin coating, dry laminating, screen printing, or other methods known in the prior art. This photoresist layer is exposed through a photomask and developed to form a pattern of discrete pads of photoresist on the substrate. Diamond grit is then distributed in a continuous layer across the surface of the substrate and the combination is heated to a temperature at which the grit will stick to the softened photoresist layer. The substrate is cooled and excess grit is removed from the surface leaving only those grit particles which have adhered to the photoresist pads. Individual placement of grit particles is then achieved at an accuracy and location determined by the pattern of the photomask which is used to expose the photoresist layer. The pattern in the photomask can be adjusted to optimize the performance of the CMP process.

After the application of the mono-layer of large diamond grit onto the substrate surface, a uniform layer 30 of CVD diamond is grown onto the exposed surface of substrate 26. The preferred method of CVD diamond deposition is carried out using a hot filament CVD (HFCVD) reactor of the type described and claimed in Garg, et al., U.S. Pat. No. 5,186,973, issued Feb. 16, 1993; the portions relevant to growing CVD diamond onto substrates are incorporated by reference herein. However, other CVD methods known in the prior art can be used, such as DC plasma, RF plasma, microwave plasma, or RF plasma arc-jet deposition of diamond from gaseous precursor materials.

Preferably, the CVD diamond is chemical vapor deposited onto the surface of the substrate such that the CVD diamond layer exhibits enhanced crystal orientation in either the (220) or the (311) direction and the (400) direction over that of randomly oriented polycrystalline diamond. The phrase "chemical vapor deposited" is intended to include the deposition of a layer of CVD diamond resulting from the decomposition of a feed gas mixture of hydrogen and carbon compounds, preferably hydrocarbons, into diamond generating carbon atoms from a gas phase activated in such a way as to avoid substantially graphitic carbon deposition. The preferred types of hydrocarbons include $C_1$–$C_4$ saturated hydrocarbons such as methane, ethane, propane and butane; $C_1$–$C_4$ unsaturated hydrocarbons, such as acetylene, ethylene, propylene and butylene, gases containing C and O such as carbon monoxide and carbon dioxide, aromatic compounds such as benzene, toluene, xylene, and the like; and organic compounds containing C, H, and at least one oxygen and/or nitrogen such as methanol, ethanol, propanol, dimethyl ether, diethyl ether, methyl amine, ethyl amine, acetone, and similar compounds. The concentration of carbon compounds in the hydrogen gas can vary from about 0.1% to about 10%, preferably from about 0.2 to about 7%, and more preferably from about 0.5 to about 5%. The resulting diamond film in the HFCVD deposition method is in the form of adherent individual crystallites or a layer-like agglomerates of crystallities substantially free from intercrystalline adhesion binder.

The total thickness of the CVD diamond is at least about 10% of the grit size. Preferably, the total thickness of the diamond film is about 10 to 250 microns. Still more preferably, it is about 20 to 30 microns.

The HFCVD process involves activating a feed gaseous mixture containing a mixture of a hydrocarbon and hydrogen by heated filament and flowing the activated gaseous mixture over a heated substrate to deposit the polycrystalline diamond film. The feed gas mixture, containing from 0.1 to about 10% hydrocarbon in hydrogen, is thermally activated under sub-atmosphere pressure, i.e. no greater than 100 Torr, to produce hydrocarbon radicals and atomic hydrogen by using a heated filament made of W, Ta, Mo, Re or a mixture thereof. The filament ranges from about 1800° to 2800° C. The substrate is heated to a deposition temperature of about 600° to about 1100° C.

The surface roughness resulting from simply growing CVD diamond on a silicon substrate ranges from about 6 to 12 microns from peak-to-valley on a substrate having a thickness of 25 microns of CVD diamond. In general, the surface roughness for a typical operation ranges from about ¼ to about ½ the thickness of the CVD diamond that is grown on the substrate. This degree of surface roughness is too low to provide the desired abrasive efficiency for CMP conditioning operations. In the present invention, diamond grit, commercially available from the cutting of natural diamonds and from synthetic industrial grade diamonds, is incorporated into the structure of the thin CVD film. The size of the grit is chosen so that the peak-to-valley surface distance is greater than the thickness of the CVD diamond film. The diamond grit is uniformly distributed over the surface of the substrate at a density such that the individual grains are separated by no less than ½ the average grain diameter. The average size of the diamond grit is in the range of about 15 microns to about 150 microns, preferably in the range of about 35 microns to about 70 microns. By controlling the size and density of the diamond grit, the abrasive characteristics of the resulting surface can be adjusted for various conditioning applications. The grain size on a given disk will be equal in size to approximately ±20%.

After the uniform distribution of a mono-layer of diamond grit 28 onto the surface of substrate 26 at a density of about 0.1 to about 50 grains per $mm^2$, preferably about 1 to about 30 grains per $mm^2$, and the chemical vapor deposition of diamond outer layer 30 onto grit 28 and substrate 26, the overall thickness of conditioning disk 34 is increased by about 40 to about 150 microns. In the case of silicon substrates, the silicon is often bonded to backing plate 32 using well known adhesives to give conditioning disk 34 greater stability. Typically backing plate 32 comprises magnetic stainless steel having a thickness of about 0.04 to 0.08 inch.

FIG. 4 shows a cross-section of conditioning disk 40 in accordance with another embodiment of the present invention in which interlayer 35 of CVD diamond is initially deposited on substrate 26 and then diamond grit 28 is uniformly distributed on the entire exposed surface of CVD diamond interlayer 35. The remaining steps set forth above in the preparation of conditioning disk 34 are repeated resulting in disk 40 in which diamond grit particles 28 can be placed closer together because of the improved bonding of the diamond particles to CVD diamond interlayer 35 before the outer coat 30 of CVD diamond is grown over grit 28. This embodiment is effective when diamond grit having a size greater than 100 microns is used.

FIGS. 5A and 5B show a cross-section of conditioning disk 50 in accordance with still another embodiment of the present invention in which substrate 26 is prepared for CVD diamond deposition by a two-step diamond seeding method. In the first step, a mono-layer of large diamond grit 28 having a size in the range of approximately 40 microns to approximately 150 microns, more typically 60 microns is uniformly applied over the entire exposed surface of substrate 26 at a density of approximately 0.1 to 50 grains per $mm^2$. This is followed by the second step in which a layer of small diamond seeds 36 having a having a size in the range of approximately 0.01 microns to approximately 1 micron is uniformly distributed over the entire exposed surface of diamond grit 28 and the areas of substrate 26 in between particles of large diamond grit 28 at a density of about 5000 grains per $mm^2$, preferably in the range of about 1000 to $10^5$ grains per $mm^2$. Application of the uniform layers of large diamond grit 28 and small diamond seeds 36 may be performed by the aforementioned mechanical dispersion techniques or any of the second through fifth seeding methods. CVD diamond is then grown over the diamond seeds 36 and diamond grit 28 as shown in FIG. 5A so outer layer 30 is polycrystalline diamond instead of epitaxial diamond.

It is believed that disk 50 of this embodiment is an improvement over prior art as shown in FIG. 2, as well as that shown in FIG. 3, because of improved bonding between diamond grit 28 and outer layer 30. The smaller diamond seeds 36, covering the larger diamond grit 28 and substrate 26, grow together to form a continuous outer layer 30. This enhances the attachment of the large grit 28 to substrate 26 through growth interconnections provided by layer 30, resulting in robust adhesion. This minimizes the chance of the large diamond grit coming loose during the conditioning pad use. In addition, for the previously described non-mechanical second through fifth seeding methods, because the large diamond grit and small diamond seeds are held more securely in place prior to CVD diamond deposition, deposition onto substrates in either horizontal or vertical fixturing geometry inside the CVD diamond deposition reactor chamber is possible.

FIG. 6 illustrates another embodiment of the present invention in which disk 60 comprises substrate 26 having first side 62 and second side 64 both covered with diamond grit 28 and encased with CVD diamond 30. In this embodiment, substrate 26 having diamond grit 28 on both sides 62 and 64 can be fixtured into a CVD reactor in such a manner well known in the art so that both sides are exposed to the feed gas mixture. Alternatively, substrate 26 is placed in the CVD reactor with diamond grit covered first side 62 exposed and the first side is encased with CVD diamond 30 in a first step. Sequentially, the first step is repeated with diamond grit covered second side 64 exposed and the second side is encased in a second step. Disk 50 can be used for conditioning polishing pads used in double sided polishers such as those for polishing silicon wafers and disks used in computer hard disk drives.

FIGS. 7, 7A and 8 show an embodiment of the present invention in which shield 50 having an evenly spaced pattern of shapes, e.g. dots 52, is used to obtain highly uniform distribution of concentrated areas of diamond grit 28 over the exposed surface of wafer 26. Dots 52 can also be in the form of squares, swirls, bars and other shapes. Shield 50 can be of any material, preferably a thermoplastic.

FIGS. 9A–9E show a preferred embodiment of the present invention in which coating 70 of a photoresist is applied over the entire exposed surface of substrate 26 (FIG. 9A). Coating 70 of photoresist is exposed though an appropriate mask to form a pattern of photoresist pads or mesas 72 (FIG. 9B). A continuous layer of diamond grit 28 is distributed over mesas 72 and the exposed surface of substrate 26 (FIG. 9C). Substrate 26 having the layer of diamond grit 28 is placed in an oven and heated to about 120° C. (or equivalent softening temperature of the photoresist used) to cause the mesas to soften. This allows that portion of diamond grit 28 distributed on mesas 72 to become embedded in at least the top layer of mesas 72 as shown in FIG. 9D. Substrate 26 is removed from the oven and cooled to room temperature causing diamond grit 28 embedded on mesas 72 to adhere firmly thereto. If the pad size is about 30 to about 60 percent of the size of the diamond grit then there will be only one grit particle which adheres to each pad. If smaller grit particles are present, then two of the smaller particles may adhere to the pad yielding a composite size which approximates one of the larger grit particles. The remaining portion of diamond grit 28 is removed from the exposed surface of substrate 26 and is ready to be placed in the CVD reactor and the growth of CVD diamond binder layer 30 is commenced. As a result of the temperatures used during the CVD process, photoresist pad 72 evaporates and/or is consumed by the hydrogen in the reactor and diamond grit 28 settles to the surface of substrate 26 and is encased within CVD diamond binder layer 30 (FIG. 9E). Polishing pad conditioning head 76 having highly uniform distribution of diamond grit 28 is recovered from the CVD reactor.

FIGS. 9B–9E also show another preferred embodiment of the present invention in which coating 70 of a screen printing compound such as ethyl cellulose is applied over the entire exposed surface of substrate 26 (FIG. 9B) through a screen printing stencil using well known screen printing techniques to form a resist pattern of dots composed of the screen printing compound. These dots have substantial tackiness and can be covered with a continuous layer of diamond grit before they have dried as shown in FIG. 9C. This allows that portion of diamond grit 28 distributed on mesas 72 to become embedded in at least the top layer of mesas 72. After drying excess grit is removed leaving the structure shown in FIG. 9D which and is ready to be placed in the CVD reactor and the growth of CVD diamond binder layer 30 is commenced. As a result of the temperatures used during the CVD process, the screen printed pad 72 evaporates and/or is consumed by the hydrogen in the reactor and diamond grit 28 settles to the surface of substrate 26 and is encased within CVD diamond binder layer 30 (FIG. 9E). Polishing pad conditioning head 76 having highly uniform distribution of diamond grit 28 is recovered from the CVD reactor.

FIG. 10 shows conditioning head 78, comprising non-uniformly distributed diamond grit 28 on wafer 26 and encased in CVD diamond layer 30, and the resulting deflection head 78 makes with polishing pad 14 as head 78 conditions pad 14 in the manner shown in FIG. 1. FIG. 10 shows that as a result of the random distribution of the diamond grit on wafer 26, head 78 makes a non-uniform contact with polishing pad 14. This results in non-uniform wear of head 78.

FIG. 11 shows conditioning head 76 in accordance with a preferred embodiment of the present invention, and the resulting deflection head 78 makes with polishing pad 14 as head 78 conditions pad 14 in the manner shown in FIG. 1. Because of the highly uniform distribution of diamond grit 28 on wafer 26, head 76 produces a very uniform deflection of pad 14 and very uniform wear of head 78.

CONTROLS AND EXAMPLES

The controls and examples and discussion which follow further illustrate the superior performance of the conditioning heads of the present invention compared with those of the prior art. The controls and examples are for illustrative purposes and are not meant to limit the scope of the claims in any way.

Control 1

A prior art conditioning disk of the type shown in FIG. 2 and commercially available as a Sample-Marshall 100 grit disk, was mounted on a conditioning arm on Model 6DS-SP Strasbaugh Planizer and tested to determine the standard removal rate and polishing pad wear rate. The disk had a diameter of four inches and contained approximately 120,000 diamond particles having an average size of 100 microns nickel plated via a wet chemical process to a magnetic stainless steel plate. The results on this standard conditioning disk indicated that the polishing pad wear rate was such that up to 2000 wafers could be polished at a wafer removal rate of about 1800Å per minute.

Control 2

A four (4) inch diameter tungsten carbide disk having a thickness of 0.25 inch was machined to form a grid of raised squares with trenches between each square. The machined disk was placed flat on a support fixture of an HFCVD reactor of the type generally described and claimed in the above-referenced Garg, et al., U.S. Pat. No. 5,186,973, as modified in accordance with the teachings of a Herlinger, et al. U.S. Ser. No. 08/575,763, filed Dec. 20, 1995, and assigned to sp$^3$, Inc., the assignee of the copending invention, the relevant portions of which are incorporated herein by reference. The reactor was closed and 15.95 kW (145 volts and 110 amps) were supplied to heat the filament to about 2000° C. A mixture of 72 sccm (standard cubic centimeters per minute) of methane, about 2.5 vol. %, in 3.0 slpm (standard liters per minute) of hydrogen was fed into the reactor for a period of 1 hour and 30 minutes at a pressure of 30 Torr to deposit about 1–2 microns of polycrystalline diamond onto the exposed surface of the machined disk containing the raised squares. The power was increased to 21.24 kW (177 volts and 120 amps) at a pressure of 25 Torr for an additional 21 hours and 30 minutes. The filament power was turned off and the coated wafer was cooled to room temperature under flowing hydrogen gas. A total of 10–15 microns of coherent polycrystalline diamond was deposited onto the wafer. The resulting conditioning disk had raised squares approximately 0.125 inch on each side with 0.125 inch trenches separating the raised squares. The disk was mounted on a conditioning arm on Model 6DS-SP Strasbaugh Planizer and tested to determine its effectiveness compared with the standard conditioning disk comprising nickel plated diamond grit on stainless steel set forth under Control 1. The results using this disk indicated that the material removal rate was approximately 63% of the typical removal rate using the standard conditioning disk. No noticeable difference was demonstrated in the wear on the polishing pad

Control 3

A layer of photoresist can be deposited on a polycrystalline silicon substrate, exposed and developed to form a pyramidal pattern and a hard diamond film can then be grown on the patterned substrate using a procedure taught in Appel, et al., U.S. Pat. No. 5,536,202, to form a conditioning disk. Based on the results from preliminary experiments with similar patterned disks, it is believed that such a conditioning disk will not be able to achieve the removal rate of the standard conditioning disk.

EXAMPLE 1

A four (4) inch diameter silicon substrate having a thickness of 0.04 inch (~1 mm) was placed flat on a support fixture of an HFCVD reactor of the type described and claimed in the above-referenced Garg, et al., U.S. Pat. No. 5,186,973, as modified in accordance with the teachings of the above-referenced Herlinger, et al. U.S. Ser. No. 08/575,763. A mono-layer of synthetic diamond grit having an average particle diameter of about 50 microns was uniformly distributed over the entire exposed surface of the first side of the silicon substrate to achieve an average grit density of 20 grains or grit particles per mm$^2$ and a range from 15 to 30 grains per mm$^2$. The grit from a container was uniformly distributed by using an air dispersion technique in which the grit was dropped at a controlled rate from a fixed height, i.e. about three inches, above the wafer. A moving air current was used to disperse the grit in a lateral direction across the substrate. The grit container was moved in a direction orthogonal to the direction of the air current while the grit was dropping onto the wafer to provide a uniform distribution of grit across the entire exposed surface of the substrate. The substrate was rotated 90 degrees three times while this same air dispersion technique was repeated. Density of the grit is controlled by both the supply rate of the grit feed as well as the rate of translation of the substrate. Alternatively, the substrate can be moved in an orthogonal direction while the grit is being dropped onto the wafer to provide a uniform distribution of grit across the entire exposed surface of the substrate.

The substrate was then placed in the CVD diamond deposition reactor. The reactor was closed and 15.95 kW (145 volts and 110 amps) were supplied to heat the filament to about 2000° C. A mixture of 72 sccm (standard cubic centimeters per minute) of methane in 3.0 slpm (standard liters per minute) of hydrogen was fed into the reactor for a period of 1 hour and 30 minutes at a pressure of 30 Torr to deposit about 1–2 microns of polycrystalline diamond onto the exposed surface of the diamond grit and the silicon substrate. The power was increased to 21.24 kW (177 volts and 120 amps) at a pressure of 25 Torr for an additional 21 hours and 30 minutes. The filament power was turned off and the coated wafer was cooled to room temperature under flowing hydrogen gas. A total of 10–15 microns of coherent polycrystalline diamond was deposited onto the previously deposited CVD diamond layer. The second side of the disk from the latter step was bonded to a backing layer as illustrated in FIG. 3. The resulting conditioning head 34 was mounted on a conditioning arm on Model 6DS-SP Strasbaugh Planizer and tested to determine its effectiveness compared with the standard conditioning head comprising nickel plated diamond grit on stainless steel. The results unexpectedly indicated that the polishing pad wear rate was 42% of the wear rate obtained when using a standard conditioning disk. The disk of this Example 1 achieved a wafer material removal rate substantially equal to the standard conditioning disk.

EXAMPLE 2

The procedures of Example 1 were repeated except that the synthetic diamond grit was uniformly distributed onto the first side of the silicon substrate after the polycrystalline diamond had been grown on the silicon substrate and the coated wafer had cooled to room temperature. A mono-layer of synthetic diamond grit having an average particle size of about 100 microns was uniformly distributed over the entire exposed surface of the silicon substrate to achieve an average grit density of 2.5 grains or grit particles per $mm^2$ and a range from 0.1 to 6 grains per $mm^2$ using the air dispersion technique of Example 1 above. The reactor was closed and 15.95 kW (145 volts and 110 amps) were supplied to heat the filament to about 2000° C. A mixture of 65 sccm of methane mixed in 3.0 slpm of hydrogen was fed into the reactor for a period of 1 hour and 30 minutes at a pressure of 30 Torr to deposit about 1–2 microns of polycrystalline onto the exposed surface of the diamond grit and the silicon substrate. The power was increased to 21.24 kW (177 volts and 120 amps) at a pressure of 25 Torr for an additional 21 hours and 30 minutes. The filament power was turned off and the coated wafer was cooled to room temperature under flowing hydrogen gas. A total of 10–15 microns of coherent polycrystalline diamond was deposited onto the wafer. The second side of the disk from this step was bonded to a backing layer as illustrated in FIG. 4. The resulting conditioning head 40 was mounted on a conditioning arm on Model 6DS-SP Strasbaugh Planizer and tested to determine its effectiveness compared with the standard conditioning head comprising nickel plated diamond grit on stainless steel It was observed that pad wear rate was one-half of the pad wear rate when using the standard conditioning disk. The conditioning head of this Example 2 maintained a wafer removal rate substantially equal to the standard conditioning disk. It was also observed that the uniformity of the wafer polishing results were superior to the standard process.

EXAMPLE 3

The procedures of Example 1 were repeated on the exposed surface of the first side of the substrate except that the second side of the resulting disk was not bonded to a backing layer as illustrated in FIG. 3. Instead, the procedures of Example 1 were repeated on the exposed surface of the second side of the disk to produce a dual-sided conditioning disk as illustrated in FIG. 6. This substrate is configured to be the same diameter and same thickness as a silicon wafer or a hard disk drive media disk. In this case, the substrate was 100 mm in diameter and 0.025 inch thick. The finished conditioner is then loaded into a double-sided polisher in the same fashion as the regular product and both of the polishing pads are conditioned simultaneously.

EXAMPLE 4

The procedures of Example 1 were repeated on the exposed surface of the first side of the substrate except that the surface was protected in selected areas by a plastic shield having evenly spaced pattern squares (in place of dots 52 shown in FIGS. 7 and 7A). The shield prevented the grit from reaching certain areas on the surface of the wafer. It also allowed a highly uniform pattern of concentrated squares of grit to form on the surface of the wafer. The procedure of this example has been shown to be effective in improving slurry transport between the polishing pad and the resulting conditioner disk of this embodiment of the present invention.

Examples 5–12 below illustrate some of the various non-mechanical techniques in accordance with the present invention for application of diamond particles to substrates prior to CVD diamond deposition. Substrates may include, but are not limited to CMP conditioning pads or disks such as those illustrated in FIGS. 3, 5A and 5B. It has been found that the non-mechanical methods for application of diamond particles to a surface, such as the previously described second through fifth seeding methods are also applicable for surface preparation of substrates for CVD diamond growth for applications such as heat spreaders for thermal management, protective barrier coatings, cutting tools, and other applications. Examples 5–11 illustrate the application of a uniform layer of large diamond grit followed by a uniform layer of small diamond seeds prior to CVD diamond deposition. The following examples are illustrative, but are not meant to limit the scope of the invention in any way.

EXAMPLE 5

In preparation for CVD diamond deposition, large diamond grit and small diamond seeds were sequentially deposited onto a Si substrate from an aqueous mixture of diamond particles using the following method. A Teflon® coated magnetic stirring bar was placed in the bottom of a glass beaker of appropriate size to hold a 4-inch diameter Si substrate to be seeded. The beaker was then placed onto a magnetic stirring platform. A mixture of 40-micron diameter diamond particles in water, having a concentration of 3.5 mg/ml, was poured into the beaker. The stirring platform was turned on to provide thorough mixing of the diamond/water mixture. The speed of the stirring was increased to cause the large diamond particles to remain suspended in the liquid, but without causing splashing of the liquid from the container.

A layer of large diamond grit was applied to the substrate as follows. First, the substrate was immersed in a solution containing a 50 volume percent concentration of PEI in water for one minute. The PEI-coated substrate was removed and twice rinsed in a bath of deionized water for 30 seconds, and then spray-rinsed with a stream of deionized water. The substrate was placed vertically in the stirred diamond/water mixture for one minute. Next, the substrate was withdrawn, gently rinsed in a beaker containing deionized water, and spun dry on a wafer spinner at approximately 3000 rpm.

Next, small diamond seeds were applied to the same substrate as follows. The substrate was immersed in a solution containing a 50 volume % concentration of PEI in water for a period of 1 minute. The PEI-coated substrate was removed and gently dip rinsed twice in deionized water for 15 seconds. The substrate was dipped into a suspension of 0.25 micron diamond particles (concentration of 3.5 mg/ml) for one minute. The substrate was removed and gently rinsed in a beaker containing deionized water, and spun dry on a wafer spinner at approximately 3000 rpm. The Si substrate, having a first layer of large diamond grit, and a second uniform layer of small diamond seeds covering the large grit and the area of the substrate in between the large diamond grit particles, was then placed into a hot filament CVD reactor for diamond deposition.

EXAMPLE 6

In preparation for CVD diamond deposition, large diamond grit and small diamond seeds were sequentially deposited onto a Si substrate from an aqueous mixture of diamond particles using the following method.

A source of nitrogen gas was connected to a 150 ml PYREX® Buchner funnel, to deliver gas through a porous ceramic stone sealed into the bottom of the funnel. To control the gas flow rate, a shutoff valve and metering valve were located between the nitrogen source and the funnel. A mixture of diamond grit having a size of 50 to 60 microns and water, at a concentration of 3.5 mg/ml was poured into the funnel. The gas to the funnel was allowed to flow until bubbling was observed and the large grit became suspended. The gas flow was adjusted to maintain the suspension without causing splashing out of the funnel. Other configurations to cause bubbling, and the resulting suspension of large grit diamond particles could be constructed by one skilled in the art.

A first layer of large diamond grit was applied to the substrate as follows. First, the substrate was immersed in a solution containing a 50 volume percent concentration of PEI in water for one minute. The PEI-coated substrate was removed and twice rinsed in a bath of deionized water for 30 seconds, and then spray-rinsed with a stream of deionized water. The substrate was placed vertically into the Buchner funnel containing the bubbling diamond/water mixture for one minute. Next, the substrate was withdrawn, gently rinsed in a beaker containing deionized water, and spun dry on a wafer spinner at approximately 750 rpm.

A second layer of small diamond seeds having a size of 0.25 micron were applied over the wafer cover the wafer surface uniformly and the first layer of large diamond grit. The wafer with the large grit applied was again placed in PEI for one minute followed by a gentle dip rinse in DI water for 30 seconds. The wafer was placed in a mixture of small diamond seeds in DI water at a concentration of 35 mg/ml for one minute. The wafer was withdrawn and gently dip rinsed then spun dry at 3000 rpm. By visual inspection under an optical microscope, the distribution of the large diamond grit particles was more uniform than that which was observed in Example 5, although there were isolated areas of increased density of large diamond grit. The Si wafer substrate, having a first layer of large diamond grit, and a second uniform layer of small diamond seeds covering the large grit and the area of the substrate in between the large diamond grit particles, was then ready for CVD diamond growth.

EXAMPLE 7

The process for application of large diamond grit and small diamond seeds in Example 6 was repeated, except a mixture diamond particles in IPA was utilized rather than a solution of diamond particles in water, and after application of the large diamond grit and small diamond seeds, the wafer was rinsed in IPA prior to spin drying. By visual inspection under an optical microscope, the distribution of the large diamond grit particles was more uniform than that which was observed in Example 6. The Si wafer substrate, having a first uniform layer of large diamond grit, and a second uniform layer of small diamond seeds covering the large grit and the area of the substrate in between the large diamond grit particles, was then ready for CVD diamond growth.

EXAMPLE 8

A mixture of diamond grit, having a size of 50 to 60 microns, and IPA was prepared, with a concentration of 3 mg/ml. This mixture was poured into a PYREX® beaker. The beaker was placed on a magnetic stirring platform, which itself was on a laboratory jack stand. This allowed vertical movement of the beaker. A Teflon® coated magnetic stirring bar was placed inside the bottom of the glass beaker. Above the beaker, and attached to a ring stand, were 2 alligator clips connected to the positive and negative outputs of a DC power supply. The clips were spaced about 1 cm from each other and situated such that a wafer, and opposing electrode of similar size to the wafer, were suspended vertically facing each other and above the beaker. The electrode was a metal wafer of similar size to the Si wafer to be seeded. Si wafers were also successfully used as electrodes in prior tests. The wafer to be seeded was placed in the alligator clip connected to the positive pole of the power supply while the metal electrode was attached to the negative alligator clip. The clips held the wafer and electrode by the very edges so as not to block the surface from being seeded, but to allow enough force to hold the wafer and electrode in place. The beaker was now slowly raised, immersing the substrate and electrode, until the top edges of the electrode and wafer were almost covered with the seeding mixture. The stirring platform was turned on until the large grit was suspended, but not so fast as to cause excessive splashing. Final minor adjustments were now made to beaker height to keep the wafers fully immersed. A DC voltage of 100 V was applied for 15 seconds. The voltage was turned off and the wafer carefully withdrawn with tweezers. The seeded wafer was then placed on a spinner and spun dry at 750 rpm.

To apply a layer of the small diamond seeds, a mixture of 0.25 micron seeds, at a concentration of 35 mg/ml in IPA, was poured in a separate beaker without the application of stirring action. The wafer with large grit already applied was placed in the alligator clip connected to the positive output of the DC power supply. A voltages of 25 V was applied for 15 seconds. The wafer was carefully removed and spun dry at 750 rpm. Observation by optical microscopy and scanning electron microscopy showed that the large diamond grit, and the spaces between the large grit on the Si wafer surface, were covered with a uniform layer of small diamond seeds.

EXAMPLE 9

A Buchner funnel was set up in the same manner as outlined in Example 6. A mixture of diamond grit having a size of 50 to 60 microns and IPA, at a concentration of 3.5 mg/ml, was poured into the funnel. The gas flow rate to the funnel was increased until bubbling was observed, and the large grit became suspended in the IPA solution as in Example 6. The funnel was placed on a ring stand. Then, the same procedure to apply a first layer of large diamond grit, with the wafer as the positive electrode and a metal negative counter-electrode, as described in Example 8 was followed. Next, a second layer of small diamond seeds was applied using the same procedure outlined in Example 8 was followed, except the 0.25 micron seeds were mixed with IPA at a concentration of 35 mg/ml.

EXAMPLE 10

A uniform coating of positive photoresist is applied to the substrate wafer by standard photolithography techniques.

The photoresist is exposed by UV light, uniformly over the whole surface through a photomask. The pattern of the photomask is a regular array of dots, squares, or other shapes. The size of the shapes used for the photomask are about one-half to one-third of the largest dimension of the large diamond grit. After the exposure is completed, the photoresist is developed. For example, in the most standard method for development of the exposed photoresist, the substrate wafer is dipped into a solution of photoresist developer, such as a dilute solution of sodium hydroxide, for the appropriate time needed to remove the exposed areas of photoresist material from the substrate wafer leaving behind the regular array of unexposed material or mesas replicating the pattern of the photomask. Following completion of the development of the photoresist, the substrate is rinsed in DI water and dried.

The large diamond grit is now uniformly dispersed over the surface of the patterned wafer. The substrate wafer is heated until the photoresist mesas left on the wafer soften adequately to allow the large diamond grit to settle into them. After this softening and settling occurs, the substrate wafer is allowed to cool below the softening point of the photoresist, which fixes the large diamond grit into place on the mesas. Next, the excess large diamond grit is removed from the surface leaving behind a single particle of large diamond grit attached to each mesa of photoresist material replicating the pattern of the original photomask. Next, the substrate wafer is placed into a CVD reactor for deposition of a CVD diamond binder layer to the desired thickness.

EXAMPLE 11

The procedure in Example 10 is repeated, but application of a second uniform layer of small diamond seeds is performed after the application of the large diamond grit. Seeding of the wafer which has been patterned with the large diamond grit attached to the photoresist mesas is accomplished by any of the non-mechanical seeding methods such as those described in Examples 5 through 9 above. After this step, the substrate wafer is covered by two uniform layers of diamond, a first layer of large diamond grit, and a second uniform layer of small diamond seeds which are attached to the large diamond grit and to the areas on the substrate wafer but in between the large diamond grit. Next, the substrate wafer is placed into a CVD reactor for deposition of a CVD diamond binder layer to the desired thickness.

EXAMPLE 12

A two (2) inch diameter silicon substrate having a thickness of 0.04 inch (~1 mm) was placed flat on a support fixture of an HFCVD reactor of the type described and claimed in the above-referenced Garg, et al., U.S. Pat. No. 5,186,973, as modified in accordance with the teachings of the above-referenced Herlinger, et al. U.S. Ser. No. 08/575, 763. A mono-layer of synthetic diamond grit having an average particle diameter of about 50 microns was uniformly distributed over the entire exposed surface of the first side of the silicon substrate to achieve a measured pitch of 0.4 mm or grit density of 6.25 grains or grit particles per $mm^2$. The grit from a container was uniformly distributed by first coating the substrate with AZ1350H photoresist. The photoresist was exposed through a mask to create a pattern of 20-micron diameter dots on the substrate which were spaced at a pitch of 0.4 mm. The substrate was heated to 120° C. and diamond grit of nominal 50 micron size was distributed in a continuous layer over the substrate. The substrate was cooled to room temperature and inverted to allow any grit not in contact with a photoresist dot to fall off of the substrate.

The substrate was then placed in the CVD diamond deposition reactor. The reactor was closed and 15.95 kW (145 volts and 110 amps) were supplied to heat the filament to about 2000° C. A mixture of 72 sccm (standard cubic centimeters per minute) of methane in 3.0 slpm (standard liters per minute) of hydrogen was fed into the reactor for a period of 1 hour and 30 minutes at a pressure of 30 Torr to deposit about 1–2 microns of polycrystalline diamond onto the exposed surface of the diamond grit and the silicon substrate. The power was increased to 21.24 kW (177 volts and 120 amps) at a pressure of 25 Torr for an additional 21 hours and 30 minutes. The filament power was turned off and the coated wafer was cooled to room temperature under flowing hydrogen gas. A total of 10–15 microns of coherent polycrystalline diamond was deposited onto the previously deposited CVD diamond layer. The second side of the disk from the latter step was bonded to a backing layer as illustrated in FIG. 3.

Without departing from the spirit and scope of this invention, one of ordinary skill in the art can make various changes and modifications to the invention to adapt it to various usages and conditions. As such, these changes and modifications are properly, equitably, and intended to be, within the full range of equivalents of the following claims.

What is claimed:

1. A method of making a polishing pad conditioning head comprising the steps of:
   (a) distributing a mono-layer of diamond grit having an average particle diameter in the range of about 15 to about 150 microns in a highly uniform manner over the exposed surface of a substrate using the diamond grit on the surface of the substrate selected from the group consisting of diamond grit on a uniform resist pattern and diamond grit in a liquid mixture;
   (b) placing the resulting grit covered substrate into a chemical vapor deposition reactor;
   (c) heating said grit covered substrate to a deposition temperature of about 600° to about 1100° C.;
   (d) chemical vapor depositing an outer layer of coherent polycrystalline diamond onto the exposed surface of the grit covered substrate by passing a gaseous mixture of about 0.1% to about 10% hydrocarbon and the balance hydrogen into said reactor under a pressure of not greater than 100 Torr;
   (e) recovering a polishing pad conditioning head having a grit covered substrate encased in polycrystalline diamond having a thickness of at least about 10% of the grit size.

2. The method of claim 1 wherein the chemical vapor deposition step is carried out by means of a filament electrically charged to a temperature in the range of about 1800° to 2800° C.

3. The method of claim 1 wherein average grain size of the diamond grit is in the range of about 35 microns to about 70 microns.

4. The method of claim 1 wherein said grit is uniformly distributed on the surface of said substrate at a density of about 0.1 to about 50 grains per $mm^2$.

5. The method of claim 4 wherein said grit is uniformly disbursed on the surface of said substrate at a density of about 1 to about 30 grains per $mm^2$.

6. The method of claim 1 wherein a layer of diamond seed having an average diameter less than 1 micron is distributed in a uniform manner over the exposed surface of said substrate after the distribution of said diamond grit and prior to the chemical vapor deposition of said outer layer of diamond.

7. The method of claim 1 wherein the resulting disk is bonded to a backing layer.

8. The method of claim 1 wherein said diamond grit is distributed in a highly uniform manner by the sequential steps of:

(a) applying a screen printing coating over the surface of said substrate to form a uniform resist pattern;

(b) distributing said diamond grit over the uniform pattern on the surface of said substrate;

(c) drying said substrate so that said diamond grit embedded in said pattern and to adhere thereto; and (d) removing the remaining portion of said diamond grit from said substrate.

9. The method of claim 1 wherein said diamond grit is distributed in a highly uniform manner by the sequential steps of:

(a) applying a uniform coating of photoresist over the surface of said substrate;

(b) exposing and developing said coating of photoresist to form a uniform pattern of mesas;

(c) distributing said diamond grit over the uniform pattern on the surface of said substrate;

(d) heating said substrate to cause said pattern to soften and said diamond grit to become embedded therein;

(e) cooling said substrate so that said diamond grit embedded in said pattern and to adhere thereto; and (f) removing the remaining portion of said diamond grit from said substrate.

10. The method of claim 9 wherein a layer of diamond seed having an average diameter less than 1 micron is distributed over the exposed surface of said substrate and diamond grit after the step of removing the remaining portion of said diamond grit from said substrate.

11. The method of claim 1 wherein said diamond grit is distributed in a highly uniform manner by the sequential steps of:

(a) immersing a positively charged substrate in a mixture of said diamond grit in a liquid to electrostatically adsorb the negatively charged diamond grit uniformly onto the surface of said substrate;

(b) removing said substrate from the mixture; and (c) drying said substrate.

12. The method of claim 11 wherein said liquid is water.

13. The method of claim 11 wherein said liquid is an alcohol.

14. The method of claim 11 wherein a thin film polymer is applied to the surface of said substrate to impart a positive surface charge.

15. The method of claim 11 wherein said substrate is operably connected to a source of direct current to impart a positive surface charge.

16. The method of claim 11 wherein a layer of diamond seed having an average diameter less than 1 micron is distributed over the exposed surface of said substrate and diamond grit after the step of drying said substrate.

17. The method of claim 16 wherein said substrate after the drying step is immersed in a mixture of said diamond seed in a liquid and dried.

18. The method of claim 17 wherein said substrate is operably connected to a source of direct current to impart a positive surface charge before being immersed in said mixture.

19. The method of claim 16 wherein a thin film polymer is applied to the surface of said substrate after the drying step to impart a positive surface charge before being immersed in said mixture.

20. A method of making a polishing pad conditioning head comprising the steps of:

(a) placing a substrate into a chemical vapor deposition reactor;

(b) heating said substrate to a deposition temperature of about 600° to about 1100° C.;

(c) chemical vapor depositing a layer of coherent polycrystalline diamond onto the exposed surface of said substrate by passing a gaseous mixture of about 0.1% to about 10% hydrocarbon and the balance hydrogen into said reactor under a pressure of not greater than 100 Torr;

(d) distributing a mono-layer of diamond grit having an average particle diameter in the range of about 15 to about 150 microns in a highly uniform manner over the diamond layer on said substrate using the diamond grit on the diamond layer selected from the group consisting of diamond grit on a uniform resist pattern and diamond grit in a liquid mixture;

(e) placing the resulting grit covered substrate into a chemical vapor deposition reactor;

(f) heating said grit covered substrate to a deposition temperature of about 600° to about 1100° C.;

(g) chemical vapor depositing an outer layer of coherent polycrystalline diamond onto the exposed surface of the grit covered substrate by passing a gaseous mixture of about 0.1% to about 10% hydrocarbon and the balance hydrogen into said reactor under a pressure of not greater than 100 Torr; and (h) recovering a polishing pad conditioning head having a grit covered substrate encased in polycrystalline diamond having a thickness of at least about 10% of the grit size.

21. The method of claim 20 wherein the chemical vapor deposition steps are carried out by means of a filament electrically charged to a temperature in the range of about 1800° to 2800° C.

22. The method of claim 20 wherein average grain size of the diamond grit is in the range of about 35 microns to about 70 microns.

23. The method of claim 20 wherein said grit is uniformly distributed on the surface of said substrate at a density of about 0.1 to about 50 grains per $mm^2$.

24. The method of claim 23 wherein said grit is uniformly disbursed on the surface of said substrate at a density of about 1 to about 30 grains per $mm^2$.

25. The method of claim 20 wherein a layer of diamond seed having an average diameter less than 1 micron is distributed in a uniform manner over the exposed surface of said substrate after the distribution of said diamond grit and prior to the chemical vapor deposition of said outer layer of diamond.

26. The method of claim 20 wherein the resulting disk is bonded to a backing layer.

27. The method of claim 20 wherein said diamond grit is distributed in a highly uniform manner by the sequential steps of:

(a) applying a screen printing coating over the surface of said substrate to form a uniform pattern;

(b) distributing said diamond grit over the uniform pattern on the surface of said substrate;

(c) drying said substrate so that said diamond grit embedded in said pattern and to adhere thereto; and (d) removing the remaining portion of said diamond grit from said substrate.

28. The method of claim 20 wherein said diamond grit is distributed in a highly uniform manner by the sequential steps of:

(a) applying a coating of photoresist over the entire exposed surface of said substrate;

(b) exposing and developing said coating of photoresist to form a uniform pattern of mesas;

(c) distributing said diamond grit over said mesas and the exposed surface of said substrate;

(d) heating said substrate to cause said mesas to soften and said diamond grit distributed on said mesas to become embedded therein;

(e) cooling said substrate so that said diamond grit embedded on said mesas to adhere thereto; and (f) removing the remaining portion of said diamond grit from said substrate.

29. The method of claim 28 wherein a layer of diamond seed having an average diameter less than 1 micron is distributed over the exposed surface of said substrate and diamond grit after the step of removing the remaining portion of said diamond grit from said substrate.

30. The method of claim 20 wherein said diamond grit is distributed in a highly uniform manner by the sequential steps of:

(a) immersing a positively charged substrate in a mixture of said diamond grit in a liquid to electrostatically adsorb the negatively charged diamond grit uniformly onto the surface of said substrate;

(b) removing said substrate from the mixture; and (c) drying said substrate.

31. The method of claim 30 wherein said liquid is water.

32. The method of claim 30 wherein said liquid is an alcohol.

33. The method of claim 30 wherein a thin film polymer is applied to the surface of said substrate to impart a positive surface charge.

34. The method of claim 30 wherein said substrate is operably connected to a source of direct current to impart a positive surface charge.

35. The method of claim 30 wherein a layer of diamond seed having an average diameter less than 1 micron is distributed over the exposed surface of said substrate and diamond grit after the step of drying said substrate.

36. The method of claim 35 wherein said substrate after the drying step is immersed in a mixture of said diamond seed in a liquid and dried.

37. The method of claim 36 wherein said substrate is operably connected to a source of direct current to impart a positive surface charge before being immersed in said mixture.

38. The method of claim 35 wherein a thin film polymer is applied to the surface of said substrate after the drying step to impart a positive surface charge before being immersed in said mixture.

39. A method of making a polishing pad conditioning head comprising the steps of:

(a) distributing a mono-layer of diamond grit having an average particle diameter in the range of about 15 to about 150 microns in a highly uniform manner over the exposed surface of a first side of a substrate using the diamond grit on the surface of the substrate selected from the group consisting of diamond grit on a uniform resist pattern and diamond grit in a liquid mixture;

(b) placing the resulting substrate into a chemical vapor deposition reactor;

(c) heating said resulting substrate to a deposition temperature of about 600° to about 1100° C.;

(d) chemical vapor depositing an outer layer of coherent polycrystalline diamond onto the exposed surface of the grit covered side by passing a gaseous mixture of about 0.1% to about 10% hydrocarbon and the balance hydrogen into said reactor under a pressure of not greater than 100 Torr;

(e) cooling said substrate;

(f) distributing a mono-layer of diamond grit having an average particle diameter in the range of about 15 to about 150 microns in a highly uniform manner over the exposed surface of a second side of a substrate using the diamond grit on the surface of the substrate selected from the group consisting of diamond grit on a uniform resist pattern and diamond grit in a liquid mixture;

(g) repeating steps (b) through (e); and (h) recovering a polishing pad conditioning head having both sides of said substrate covered with grit and encased in polycrystalline diamond having a thickness of at least about 10% of the grit size for each side.

40. The method of claim 39 wherein the chemical vapor deposition step is carried out by means of a filament electrically charged to a temperature in the range of about 1800° to 2800° C.

41. The method of claim 39 wherein average grain size of the diamond grit is in the range of about 35 microns to about 70 microns.

42. The method of claim 39 wherein said grit is uniformly distributed on the surface of said substrate at a density of about 1 to about 50 grains per $mm^2$.

43. The method of claim 39 wherein said diamond grit is distributed in a highly uniform manner by the sequential steps of:

(a) applying a uniform coating of photoresist over the entire exposed surface of said substrate;

(b) exposing said coating of photoresist to form a uniform pattern of mesas;

(c) distributing said diamond grit over said mesas and the exposed surface of said substrate;

(d) heating said substrate to cause said mesas to soften and said diamond grit distributed on said mesas to become embedded therein;

(e) cooling said substrate so that said diamond grit embedded on said mesas to adhere thereto; and (f) removing the remaining portion of said diamond grit from said substrate.

44. The method of claim 43 wherein a layer of diamond seed having an average diameter less than 1 micron is distributed over the exposed surface of said substrate and diamond grit after the step of removing the remaining portion of said diamond grit from said substrate.

45. The method of claim 39 wherein said diamond grit is distributed in a highly uniform manner by the sequential steps of:

(a) immersing a positively charged substrate in a mixture of said diamond grit in a liquid to electrostatically adsorb the negatively charged diamond grit uniformly onto the surface of said substrate;

(b) removing said substrate from the mixture; and (c) drying said substrate.

46. The method of claim 45 wherein said liquid is water.

47. The method of claim 45 wherein said liquid is an alcohol.

48. The method of claim 45 wherein a thin film polymer is applied to the surface of said substrate after the drying step to impart a positive surface charge.

49. The method of claim 45 wherein said substrate is operably connected to a source of direct current to impart a positive surface charge.

50. The method of claim 45 wherein a layer of diamond seed having an average diameter less than 1 micron is distributed over the exposed surface of said substrate and diamond grit after the step of drying said substrate.

51. The method of claim 50 wherein said substrate after the drying step is immersed in a mixture of said diamond seed in a liquid and dried.

52. The method of claim 51 wherein said substrate is operably connected to a source of direct current to impart a positive surface charge before being immersed in said mixture.

53. The method of claim 50 wherein a thin film polymer is applied to the surface of said substrate after the drying step to impart a positive surface charge before being immersed in said mixture.

* * * * *